United States Patent
Gangundi et al.

(10) Patent No.: US 11,726,188 B2
(45) Date of Patent: Aug. 15, 2023

(54) ELIMINATING SENSOR SELF-HIT DATA

(71) Applicant: GM Cruise Holdings LLC, San Francisco, CA (US)

(72) Inventors: Sandeep Gangundi, Milpitas, CA (US); Avinash Nair, Mexico City (MX); Abdelrahman Elogeel, Sunnyvale, CA (US); Kyle Vogt, San Francisco, CA (US); Cornelis Jacob Lekkerkerker, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 467 days.

(21) Appl. No.: 16/855,478

(22) Filed: Apr. 22, 2020

(65) Prior Publication Data
US 2021/0333373 A1  Oct. 28, 2021

(51) Int. Cl.
  *G01S 7/487* (2006.01)
  *G01S 17/931* (2020.01)
  *G06F 30/15* (2020.01)
  *G01S 7/48* (2006.01)
  *G01S 7/493* (2006.01)

(52) U.S. Cl.
  CPC .......... *G01S 7/4876* (2013.01); *G01S 7/4802* (2013.01); *G01S 7/493* (2013.01); *G01S 17/931* (2020.01); *G06F 30/15* (2020.01)

(58) Field of Classification Search
  CPC ...... G01S 17/89; G01S 7/4802; G01S 7/4876; G01S 7/493; G06F 30/15
  See application file for complete search history.

(56) References Cited

U.S. PATENT DOCUMENTS

| | | | |
|---|---|---|---|
| 2007/0279493 A1* | 12/2007 | Edanami | B62D 15/028 348/148 |
| 2016/0344973 A1* | 11/2016 | Huebner | G06T 3/0018 |
| 2018/0203445 A1 | 7/2018 | Micks et al. | |
| 2019/0066408 A1* | 2/2019 | Vijayan | G06F 30/15 |
| 2020/0041997 A1 | 2/2020 | Tuukkanen et al. | |
| 2020/0191914 A1* | 6/2020 | Kunz | G01S 17/931 |
| 2021/0001891 A1* | 1/2021 | Majithia | B60W 60/0025 |
| 2021/0048533 A1* | 2/2021 | Agarwal | G06T 17/00 |
| 2021/0201050 A1* | 7/2021 | Marschner | G06V 20/182 |
| 2022/0091271 A1* | 3/2022 | Iwase | G01S 17/86 |

FOREIGN PATENT DOCUMENTS

WO   2019234814 A1   12/2019

OTHER PUBLICATIONS

International Search Report and Written Opinion for Application No. PCT/US2021/028630, dated Jul. 27, 2021, 9 Pages.

* cited by examiner

Primary Examiner — Michael J Dalbo
(74) Attorney, Agent, or Firm — Novak Druce Carroll LLP

(57) ABSTRACT

The subject disclosure relates to ways to identify self-hit data collected by autonomous vehicle (AV) sensors. In some aspects, a method of the disclosed technology includes steps for generating a geometric model of an autonomous vehicle (AV), wherein the geometric model specifies physical boundaries of the AV in three-dimensional (3D) space, collecting sensor data for an environment around the AV, and identifying one or more data points, from among the collected sensor data, that correspond with a surface of the AV. Systems and machine-readable media are also provided.

20 Claims, 5 Drawing Sheets

ELIMINATING SENSOR SELF-HIT DATA

BACKGROUND

1. Technical Field

The subject technology provides solutions for eliminating extraneous sensor signals and in particular, for reducing "self-hit" data received by a Light Detection and Ranging (LiDAR) sensor disposed on an autonomous vehicle (AV).

2. Introduction

Autonomous vehicles (AVs) are vehicles having computers and control systems that perform driving and navigation tasks that are conventionally performed by a human driver. As AV technologies continue to advance, ride-sharing services will increasingly utilize AVs to improve service efficiency and safety. However, for effective use in ride-sharing deployments, AVs will be required to perform many of the functions that are conventionally performed by human drivers, such as performing navigation and routing tasks necessary to provide a safe and efficient ride service. Such tasks may require the collection and processing of large quantities of data using various sensor types, including but not limited to cameras and/or Light Detection and Ranging (LiDAR) sensors disposed on the AV.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. In the drawings:

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Successful and safe navigation of an autonomous vehicle (AV) requires the collection of environmental sensor data to identify objects around the AV. Environmental data collection is frequently performed using sensors disposed on the AV, such as using LiDAR or camera sensors mounted to a top or side vehicle surface. However, one limitation in performing effective data capture is that the sensors often record data corresponding to a surface of the vehicle, rather than the surrounding environment. These recorded data (e.g., self-hit data points) can be useful for calculating AV boundaries and position, however it is important to distinguish self-hits from other collected data, so as to avoid confusion regarding the status and location of proximate objects. As used herein, self-hit or self-hit data refers to data associated with measurements taken on the AV, or at a location that is located on (or inside) a volume of space occupied by the AV.

Aspects of the disclosed technology provide solutions for identifying self-hit data and thereby for separating self-hit data from other environmental (sensor) data that is collected. Some implementations of the technology include the use of geometric models, such as computer aided design (CAD) models, to approximate boundaries between an AV and the surrounding environment. Additionally, aspects of the disclosed technology leverage the use of collected data to help inform the generation of geometric models, as well as buffers for the geometric models, so that the models can be used for different vehicle types.

Figure 1:
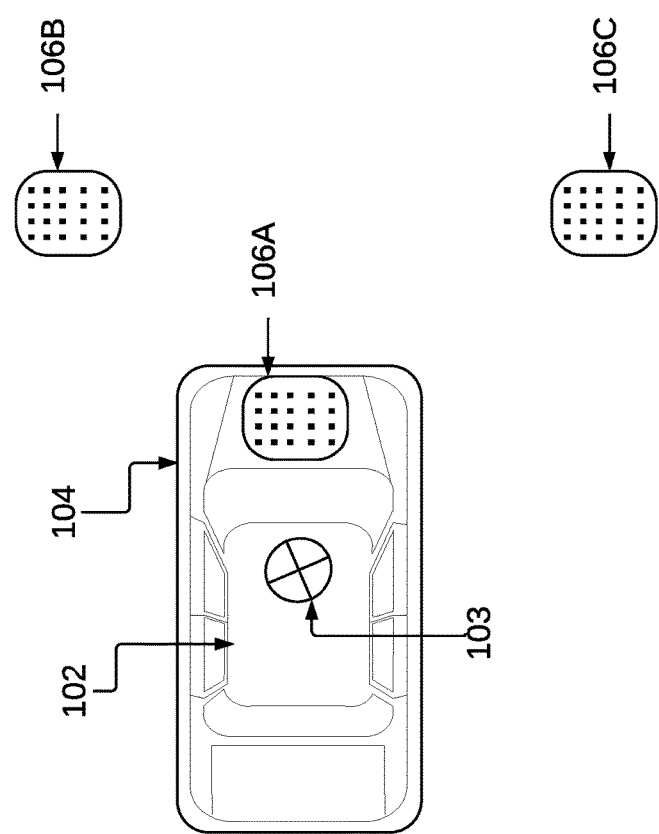
FIG. 1 illustrates an example environment in which some aspects of the disclosed technology can be implemented.

FIG. 1 illustrates an example environment 100 in which some aspects of the disclosed technology can be implemented. Environment 100 includes autonomous vehicle (AV) 102 that includes a sensor 103 configured for collecting data regarding an environment surrounding AV 102 (e.g., sensor data). Sensor 103 can represent any of a variety of sensors, including but not limited to ranging sensors such as one or more LiDAR sensors. It is understood that sensor 103 is provided as an example of an AV sensor, but that a greater number of sensors, or different sensor types, may be implemented, without departing from the disclosed technology.

Sensor 103 can represent one or more LiDAR sensors configured to collected environmental/sensor data 106 of the surrounding environment. Where LiDAR sensors are used, sensor data can be represented by one or more point clouds, wherein each data point is associated with a range (distance) corresponding with a reflecting object in environment 100. In the illustrated example, sensor data 106 consists of three separate point clouds, e.g., point cloud 106A, which is on the surface of AV 102, and point clouds 106B, 106C, located in an environment surrounding AV 102, and not on a surface of AV 102.

To help distinguish between valid environmental sensor measurements (e.g., point clouds 106B, 106C), and those measurements located on, or reflected from, a surface of AV 102 (e.g., self-hits represented by point cloud 106A), a geometric model can be used. As illustrated in environment 100, AV 102 is bounded by geometric model 104 that represents physical boundaries between AV 102 and the surrounding environment. Although illustrated in a top-down two-dimensional (2D) view, geometric model 104 can be a three-dimensional (3D) model, for example, that approximates the shape and locations of various surfaces of AV 102.

Geometric model 104 can be used to distinguish between valid environmental sensor measurements (106B, 106C) and self-hits, such as those represented by point cloud 106A. In some implementations, geometric model 104 can be used to create a mask (e.g., a bit mask) that is used to process all sensor data 106 that is collected by sensor/s 103. Using the bit mask, self-hit data can be filtered from the bulk of collected sensor data 106.

Depending on the desired implementation, geometric model 104 may be a computer-generated model such as a Computer Aided Design (CAD) model that approximates the shape of the AV exterior. In some aspects, models may be converted between coordinate systems to facilitate the removal of LiDAR self-hits recorded in the spherical coordinate system. That is, CAD models of the AV may be converted from a Cartesian coordinate system into a spherical coordinate system. By way of example, collected sensor (LiDAR) recorded in spherical coordinates—e.g., having a radial distance (r), azimuth angle (φ), and elevation angle (Θ)—can be compared to the spherical model. Those points falling inside the spherical model can be identified as self-hits. Depending on the desired implementation, self-hits may be tagged (e.g., as "rejected"), or may be segmented from the remaining sensor data.

Geometric model 104 may be created (or updated) using a calibration process in which LiDAR data is collected by sensor 103 and used to determine the boundaries of AV 102. In some aspects, error buffers can be built into geometric model 104, for example, so that the model can be applied to other vehicles of different geometries, without the need for generating a new model. Buffers can also be tuned based on other factors, such as variables affecting LiDAR calibration, so that geometric models may be applied different sensor setups and/or between different vehicles.

Figure 2:
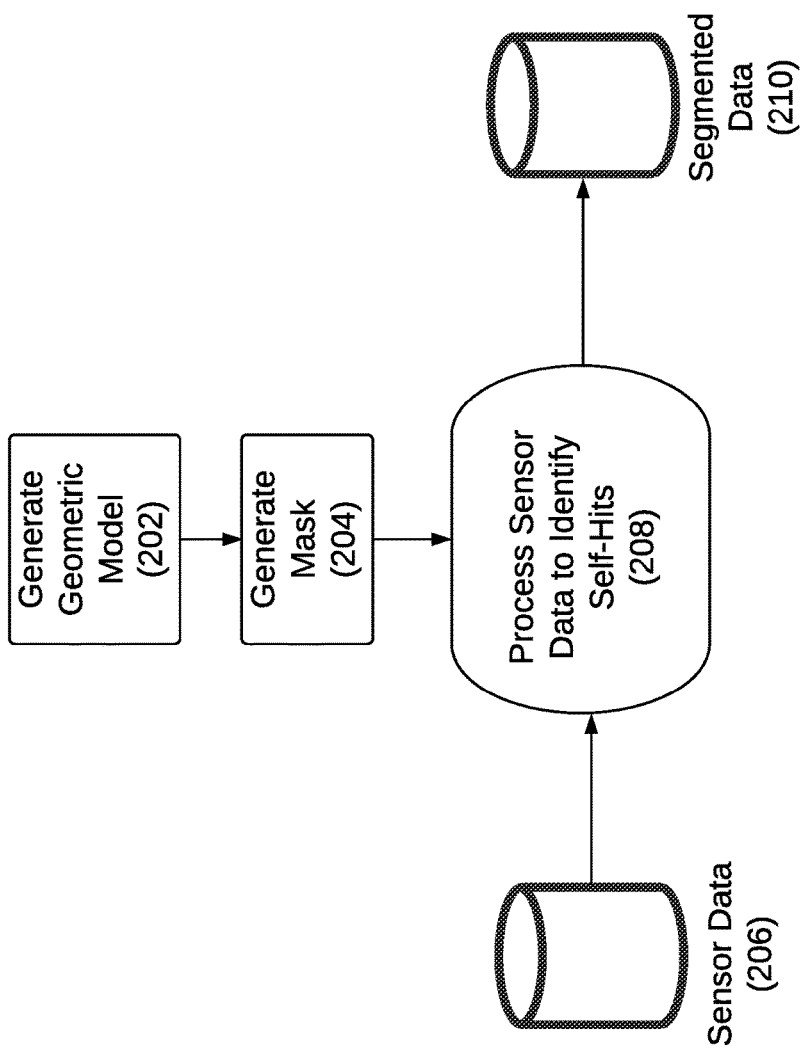
FIG. 2 illustrates an example system that can be used for implementing a self-hit identification process of the disclosed technology.

FIG. 2 illustrates an example system 200 that can be used for performing a self-hit identification process of the disclosed technology. System 200 includes processing components for generating a geometric model (202) and generating a mask (204). System 200 also includes a repository of sensor data 206, and a processing module 208 that is configured to separate self-hit data from bulk sensor data 206. As discussed above, geometric model 202 can be generated using digital models of AV geometry and/or using collected sensor data, such as LiDAR information (e.g., LiDAR test data) collected during sensor installation and calibration. Mask 204 can be generated based on geometric model 202. In some implementations, mask 204 may be a matrix used to perform transformations on arrays of collected sensor data, for example, to separate/identify self-hit values.

In practice, processing module 208 receives sensor data 206, which can include all sensor data received from sensors of one or more AVs. Processing can be performed in an online manner, for example, in which processing module 208 actively identifies self-hit data in real time (or near real time). Alternatively, processing module 208 can operate off-line, for example, in which legacy environmental/sensor data (e.g., from one of more AVs) is processed to identify self-hit data. As discussed above, self-hits can be identified by comparing collected sensor data from repository 206 to the geometric model 202 e.g., using a mask 204. Those points that fall inside the model are determined to be self-hits. Self-hit data can be logically separated from other sensor data (e.g., using metadata tags), and stored to a data repository (database) of segmented data 210.

Figure 3:
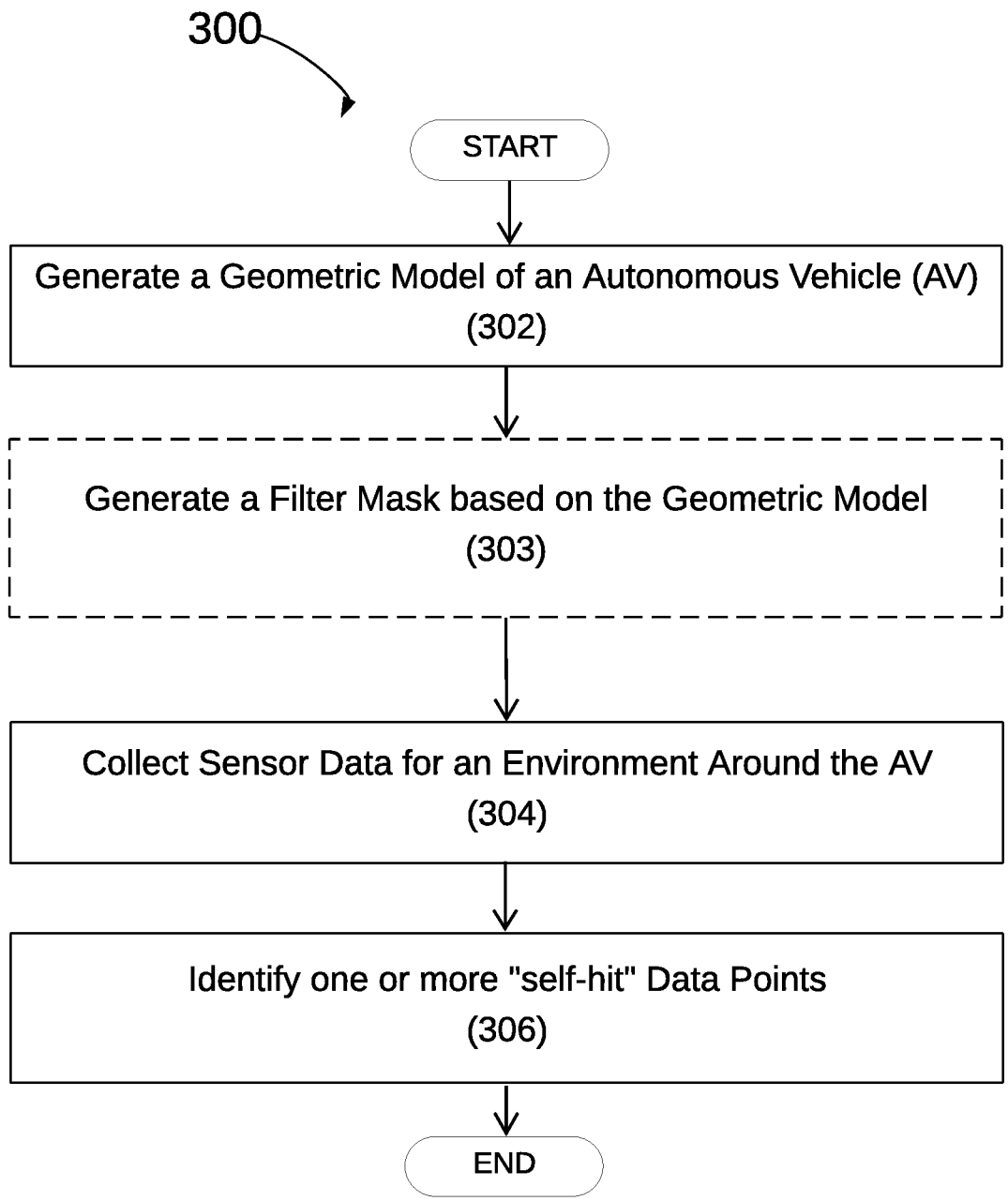
FIG. 3 illustrates steps of an example process for identifying self-hits, according to some aspects of the disclosed technology.

FIG. 3 illustrates steps of an example process 300 for identifying self-hits, according to some aspects of the technology. Process 300 begins with step 302 in which a geometric model for an autonomous vehicle (AV) is generated. As discussed above, the geometric model can be constructed to approximate an outer surface of the AV. In some implementations, the geometric model can be a CAD model; however, various other types of models may be used, without departing from the scope of the disclosed technology.

In some applications, the geometric model may be adapted into one or more other coordinate systems. For example, a 3D geometric model represented in cartesian coordinates may be adapted to another coordinate geometry, such as a spherical coordinate system. Such adaptations can facilitate the processing of sensor data to identify self-hit data points, as discussed in further detail below.

In optional step 303, a filter mask is generated based on the geometric model. Filter mask generation can be based on the geometric coordinate system of the geometric model. As discussed above, the mask can be represented as an array or vector that is used to perform transformations on collected sensor data.

In step 304, sensor data for an environment surrounding an AV is collected. Collected sensor data can be stored to a data repository, such as sensor data repository 206, discussed above. The collected sensor data can include environmental data collected by one or more sensors (e.g., LiDAR sensors) on a single AV. Alternatively, the collected sensor data can include environmental data collected by multiple sensors, for example, from two or more AVs, such as sensor data collected for part of an entire ride-sharing fleet.

In step 306, the sensor data is processed to identify any self-hits. As discussed above, such processing can include the comparison of one or more sensor data points to a geometric model representing the AV. If the data point resides within the geometric model, then the point is considered a self-hit; alternatively, if the point falls outside the model, then it is determined to not be a self-hit. As discussed above, segmented sensor data, for example, wherein self-hits are associated with metadata tags, can be stored to a separate database of processed sensor data.

Figure 4:
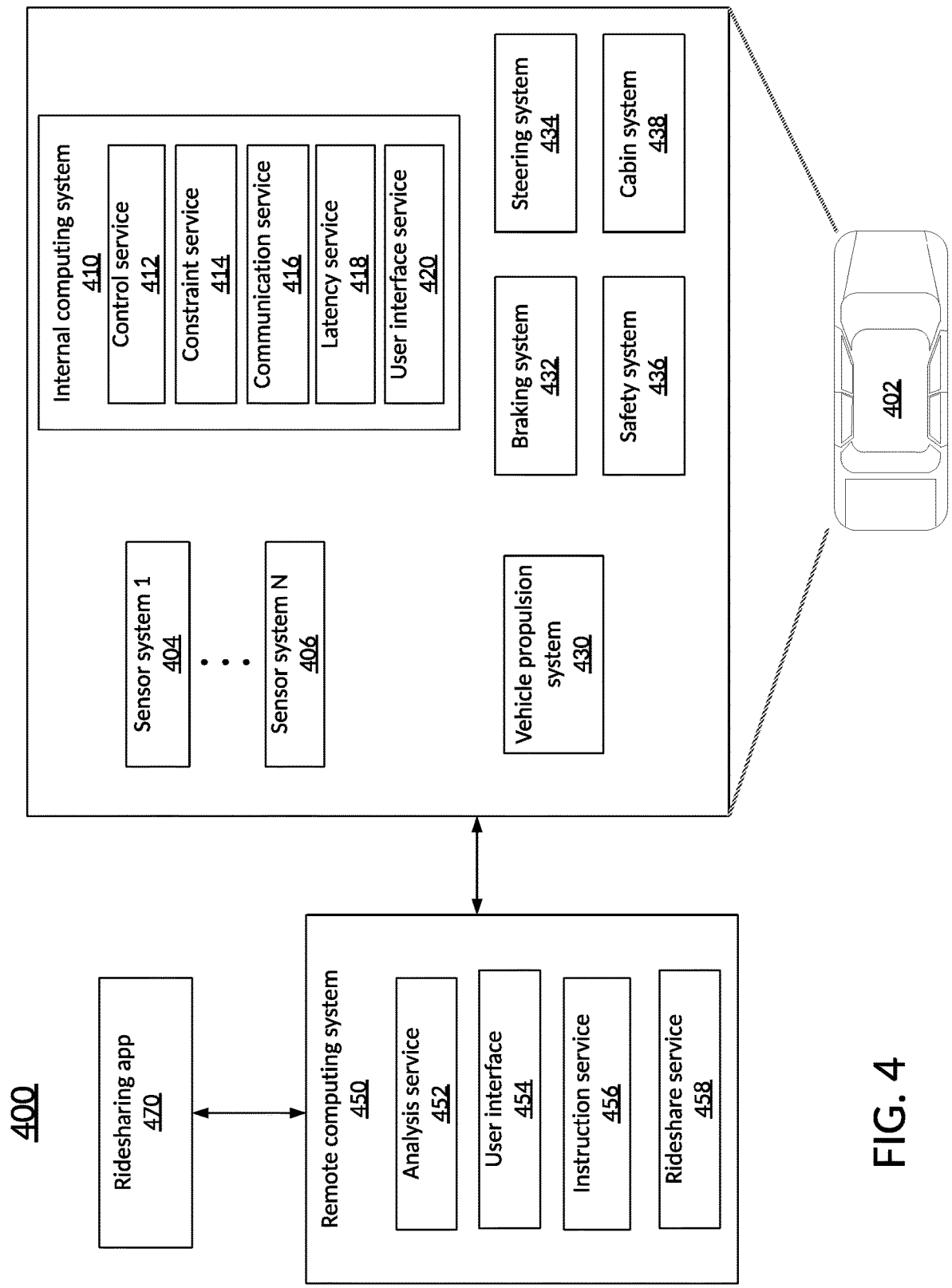
FIG. 4 illustrates an example system environment that can be used to facilitate AV dispatch and operations, according to some aspects of the disclosed technology.

FIG. 4 illustrates an example system environment that can be used to facilitate AV dispatch and operations, according to some aspects of the disclosed technology. Autonomous vehicle 402 can navigate about roadways without a human driver based upon sensor signals output by sensor systems 404-406 of autonomous vehicle 402. Autonomous vehicle 402 includes a plurality of sensor systems 404-406 (a first sensor system 104 through an Nth sensor system 106). Sensor systems 404-406 are of different types and are arranged about the autonomous vehicle 402. For example, first sensor system 404 may be a camera sensor system and the Nth sensor system 406 may be a Light Detection and Ranging (LIDAR) sensor system. Other exemplary sensor systems include radio detection and ranging (RADAR) sensor systems, Electromagnetic Detection and Ranging (EmDAR) sensor systems, Sound Navigation and Ranging (SONAR) sensor systems, Sound Detection and Ranging (SODAR) sensor systems, Global Navigation Satellite System (GNSS) receiver systems such as Global Positioning System (GPS) receiver systems, accelerometers, gyroscopes, inertial measurement units (IMU), infrared sensor systems, laser rangefinder systems, ultrasonic sensor systems, infrasonic sensor systems, microphones, or a combination thereof. While four sensors 480 are illustrated coupled to the autonomous vehicle 402, it is understood that more or fewer sensors may be coupled to the autonomous vehicle 402.

Autonomous vehicle 402 further includes several mechanical systems that are used to effectuate appropriate motion of the autonomous vehicle 402. For instance, the mechanical systems can include but are not limited to, vehicle propulsion system 430, braking system 432, and steering system 434. Vehicle propulsion system 430 may include an electric motor, an internal combustion engine, or both. The braking system 432 can include an engine brake, brake pads, actuators, and/or any other suitable componentry that is configured to assist in decelerating autonomous vehicle 402. In some cases, braking system 432 may charge a battery of the vehicle through regenerative braking. Steering system 434 includes suitable componentry that is configured to control the direction of movement of the autonomous vehicle 402 during navigation. Autonomous vehicle 402 further includes a safety system 436 that can include various lights and signal indicators, parking brake, airbags, etc. Autonomous vehicle 402 further includes a cabin system 438 that can include cabin temperature control systems, in-cabin entertainment systems, etc.

Autonomous vehicle 402 additionally comprises an internal computing system 410 that is in communication with sensor systems 480 and systems 430, 432, 434, 436, and 438. Internal computing system 410 includes at least one processor and at least one memory having computer-executable instructions that are executed by the processor. The computer-executable instructions can make up one or more services responsible for controlling autonomous vehicle 402, communicating with remote computing system 450, receiving inputs from passengers or human co-pilots, logging metrics regarding data collected by sensor systems 480 and human co-pilots, etc.

Internal computing system 410 can include a control service 412 that is configured to control operation of vehicle propulsion system 430, braking system 208, steering system 434, safety system 436, and cabin system 438. Control service 412 receives sensor signals from sensor systems 480 as well communicates with other services of internal computing system 410 to effectuate operation of autonomous vehicle 402. In some embodiments, control service 412 may carry out operations in concert one or more other systems of autonomous vehicle 402. Internal computing system 410 can also include constraint service 414 to facilitate safe propulsion of autonomous vehicle 402. Constraint service 416 includes instructions for activating a constraint based on a rule-based restriction upon operation of autonomous vehicle 402. For example, the constraint may be a restriction upon navigation that is activated in accordance with protocols configured to avoid occupying the same space as other objects, abide by traffic laws, circumvent avoidance areas, etc. In some embodiments, the constraint service can be part of control service 412.

The internal computing system 410 can also include communication service 416. The communication service 416 can include both software and hardware elements for transmitting and receiving signals from/to the remote computing system 450. Communication service 416 is configured to transmit information wirelessly over a network, for example, through an antenna array that provides personal cellular (long-term evolution (LTE), 3G, 4G, 5G, etc.) communication.

Internal computing system 410 can also include latency service 418. Latency service 418 can utilize timestamps on communications to and from remote computing system 450 to determine if a communication has been received from the remote computing system 450 in time to be useful. For example, when a service of the internal computing system 410 requests feedback from remote computing system 450 on a time-sensitive process, the latency service 418 can determine if a response was timely received from remote computing system 450 as information can quickly become too stale to be actionable. When the latency service 418 determines that a response has not been received within a threshold, latency service 418 can enable other systems of autonomous vehicle 402 or a passenger to make necessary decisions or to provide the needed feedback.

Internal computing system 410 can also include a user interface service 420 that can communicate with cabin system 438 in order to provide information or receive information to a human co-pilot or human passenger. In some embodiments, a human co-pilot or human passenger may be required to evaluate and override a constraint from constraint service 414, or the human co-pilot or human passenger may wish to provide an instruction to the autonomous vehicle 402 regarding destinations, requested routes, or other requested operations.

As described above, the remote computing system 450 is configured to send/receive a signal from the autonomous vehicle 440 regarding reporting data for training and evaluating machine learning algorithms, requesting assistance from remote computing system 450 or a human operator via the remote computing system 450, software service updates, rideshare pickup and drop off instructions, etc.

Remote computing system 450 includes an analysis service 452 that is configured to receive data from autonomous vehicle 402 and analyze the data to train or evaluate machine learning algorithms for operating the autonomous vehicle 402. The analysis service 452 can also perform analysis pertaining to data associated with one or more errors or constraints reported by autonomous vehicle 402. Remote computing system 450 can also include a user interface service 454 configured to present metrics, video, pictures, sounds reported from the autonomous vehicle 402 to an operator of remote computing system 450. User interface service 454 can further receive input instructions from an operator that can be sent to the autonomous vehicle 402.

Remote computing system 450 can also include an instruction service 456 for sending instructions regarding the operation of the autonomous vehicle 402. For example, in response to an output of the analysis service 452 or user interface service 454, instructions service 456 can prepare instructions to one or more services of the autonomous vehicle 402 or a co-pilot or passenger of the autonomous vehicle 402. Remote computing system 450 can also include rideshare service 458 configured to interact with ridesharing applications 470 operating on (potential) passenger computing devices. The rideshare service 458 can receive requests to be picked up or dropped off from passenger ridesharing app 470 and can dispatch autonomous vehicle 402 for the trip. The rideshare service 458 can also act as an intermediary between the ridesharing app 470 and the autonomous vehicle wherein a passenger might provide instructions to the autonomous vehicle to 402 go around an obstacle, change routes, honk the horn, etc. Remote computing system 450 can, in some cases, include at least one computing system 450 as illustrated in or discussed with respect to FIG.

Figure 5:
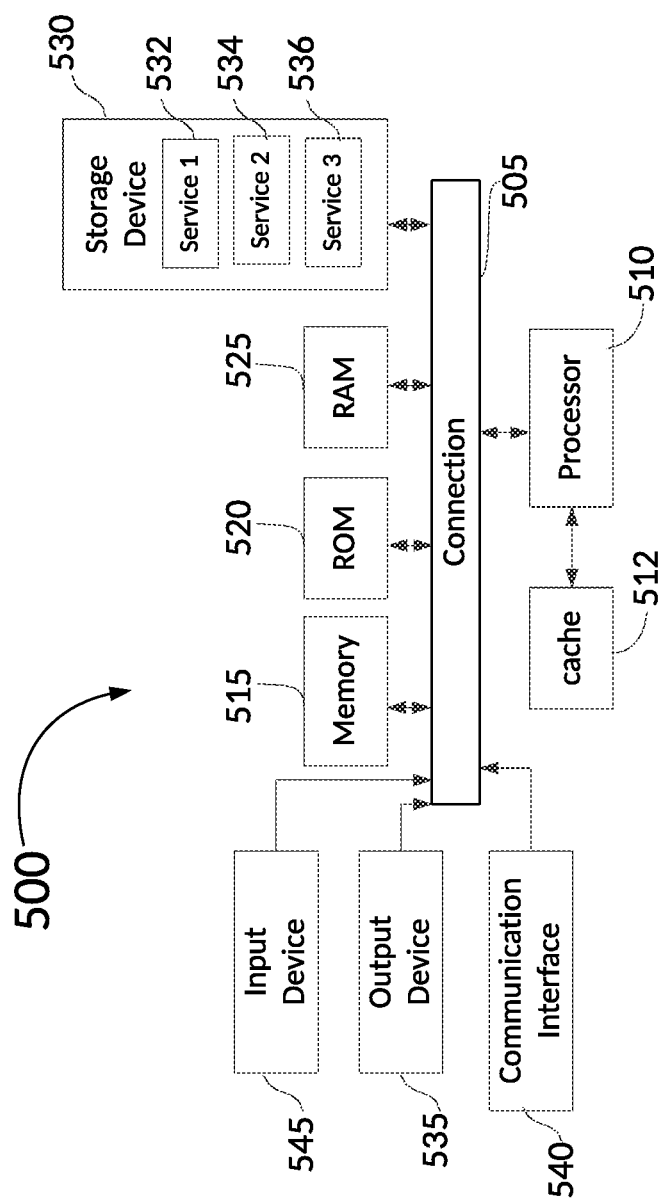
FIG. 5 illustrates an example processor-based system with which some aspects of the subject technology can be implemented.

5, or may include at least a subset of the components illustrated in FIG. 5 or discussed with respect to computing system 450.

FIG. 5 illustrates an example processor-based system with which some aspects of the subject technology can be implemented. For example, processor-based system 500 that can be any computing device making up internal computing system 410, remote computing system 450, a passenger device executing the rideshare app 470, internal computing device 430, or any component thereof in which the components of the system are in communication with each other using connection 505. Connection 505 can be a physical connection via a bus, or a direct connection into processor 510, such as in a chipset architecture. Connection 505 can also be a virtual connection, networked connection, or logical connection.

In some embodiments, computing system 500 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 500 includes at least one processing unit (CPU or processor) 510 and connection 505 that couples various system components including system memory 515, such as read-only memory (ROM) 520 and random-access memory (RAM) 525 to processor 510. Computing system 500 can include a cache of high-speed memory 512 connected directly with, in close proximity to, and/or integrated as part of processor 510.

Processor 510 can include any general purpose processor and a hardware service or software service, such as services 532, 534, and 536 stored in storage device 530, configured to control processor 510 as well as a special-purpose processor where software instructions are incorporated into the actual processor design. Processor 510 may essentially be a completely self-contained computing system, containing multiple cores or processors, a bus, memory controller, cache, etc. A multi-core processor may be symmetric or asymmetric.

To enable user interaction, computing system 500 includes an input device 545, which can represent any number of input mechanisms, such as a microphone for speech, a touch-sensitive screen for gesture or graphical input, keyboard, mouse, motion input, speech, etc. Computing system 500 can also include output device 535, which can be one or more of a number of output mechanisms known to those of skill in the art. In some instances, multimodal systems can enable a user to provide multiple types of input/output to communicate with computing system 500. Computing system 500 can include communications interface 540, which can generally govern and manage the user input and system output. The communication interface may perform or facilitate receipt and/or transmission wired or wireless communications via wired and/or wireless transceivers, including those making use of an audio jack/plug, a microphone jack/plug, a universal serial bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof.

Communications interface 540 may also include one or more Global Navigation Satellite System (GNSS) receivers or transceivers that are used to determine a location of the computing system 500 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 530 can be a non-volatile and/or non-transitory computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (L1/L2/L3/L4/L5/L #), resistive random-access memory (RRAM/ReRAM), phase change memory (PCM), spin transfer torque RAM (STT-RAM), another memory chip or cartridge, and/or a combination thereof.

Storage device 530 can include software services, servers, services, etc., that when the code that defines such software is executed by the processor 510, it causes the system to perform a function. In some embodiments, a hardware service that performs a particular function can include the software component stored in a computer-readable medium in connection with the necessary hardware components, such as processor 510, connection 505, output device 535, etc., to carry out the function.

As understood by those of skill in the art, machine-learning based classification techniques can vary depending on the desired implementation. For example, machine-learning classification schemes can utilize one or more of the following, alone or in combination: hidden Markov models; recurrent neural networks; convolutional neural networks (CNNs); deep learning; Bayesian symbolic methods; general adversarial networks (GANs); support vector machines; image registration methods; applicable rule-based system. Where regression algorithms are used, they may include including but are not limited to: a Stochastic Gradient Descent Regressor, and/or a Passive Aggressive Regressor, etc.

Machine learning classification models can also be based on clustering algorithms (e.g., a Mini-batch K-means clustering algorithm), a recommendation algorithm (e.g., a Miniwise Hashing algorithm, or Euclidean Locality-Sensitive Hashing (LSH) algorithm), and/or an anomaly detection algorithm, such as a Local outlier factor. Additionally, machine-learning models can employ a dimensionality reduction approach, such as, one or more of: a Mini-batch Dictionary Learning algorithm, an Incremental Principal Component Analysis (PCA) algorithm, a Latent Dirichlet Allocation algorithm, and/or a Mini-batch K-means algorithm, etc.

FIG. 5 illustrates an example processor-based system with which some aspects of the subject technology can be implemented. Specifically, FIG. 5 illustrates system architecture 500 wherein the components of the system are in electrical communication with each other using a bus 505. System architecture 500 can include a processing unit (CPU or processor) 510, as well as a cache 512, that are variously coupled to system bus 505. Bus 505 couples various system components including system memory 515, (e.g., read only memory (ROM) 520 and random access memory (RAM) 525, to processor 510.

System architecture 500 can include a cache of high-speed memory connected directly with, in close proximity to, or integrated as part of the processor 510. System architecture 500 can copy data from the memory 515 and/or the storage device 530 to the cache 512 for quick access by the processor 510. In this way, the cache can provide a performance boost that avoids processor 510 delays while waiting for data. These and other modules can control or be configured to control the processor 510 to perform various actions. Other system memory 515 may be available for use as well. Memory 515 can include multiple different types of memory with different performance characteristics. Processor 510 can include any general purpose processor and a hardware module or software module, such as module 1 (532), module 2 (534), and module 3 (536) stored in storage device 530, configured to control processor 510 as well as a special-purpose processor where software instructions are incorporated into the actual processor design. Processor 510 may essentially be a completely self-contained computing system, containing multiple cores or processors, a bus, memory controller, cache, etc. A multi-core processor may be symmetric or asymmetric.

To enable user interaction with the computing system architecture 500, an input device 545 can represent any number of input mechanisms, such as a microphone for speech, a touch-sensitive screen for gesture or graphical input, keyboard, mouse, motion input, speech and so forth. An output device 535 can also be one or more of a number of output mechanisms. In some instances, multimodal systems can enable a user to provide multiple types of input to communicate with the computing system architecture 500. Communications interface 540 can generally govern and manage the user input and system output. There is no restriction on operating on any particular hardware arrangement and therefore the basic features here may easily be substituted for improved hardware or firmware arrangements as they are developed.

Storage device 530 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 525, read only memory (ROM) 520, and hybrids thereof.

Storage device 530 can include software modules 532, 534, 536 for controlling processor 510. Other hardware or software modules are contemplated. Storage device 530 can be connected to the system bus 505. In one aspect, a hardware module that performs a particular function can include the software component stored in a computer-readable medium in connection with the necessary hardware components, such as the processor 510, bus 505, output device 535, and so forth, to carry out various functions of the disclosed technology.

By way of example, instruction stored on computer-readable media can be configured to cause one or more processors to perform operations including: receiving, at an AV computing system, a first dispatch request, wherein the first dispatch request is associated with a first user identifier (ID), receiving, at the AV computing system, a first recognition model, wherein the first recognition model corresponds with the first user ID, receiving, at the AV computing system, an image stream comprising one or more images of pedestrian faces, and providing the one or more images to the first recognition model. In some aspects, the instructions can further cause processors 510 to perform operations for: determining, using the first recognition model, if a first user represented in the one or more images corresponds with the first user ID, unlocking a door of the AV in response to a match between at least one of the one or more images and the first user ID, and/or updating the first recognition model in response to a match between at least one of the one or more images and the first user ID.

In some aspects, memory stored operations/instructions can be configured to further cause processors 510 to perform operations for: receiving a second recognition model corresponding with a second user ID, providing the one or more images to the second recognition model, and determining, using the second recognition model, if a second user represented by the one or more images corresponds with the second user ID. In some approaches, the operations may further cause the processors to perform operations for unlocking a door of the AV in response to a match between at least one of the one or more images and the second user ID.

Depending on the desired implementation, the first recognition model can be a machine-learning model that has been trained using a plurality of facial images of the first user, and wherein the second recognition model is a machine-learning model that has been trained using a plurality of facial images of the second user.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules can be located in both local and remote memory storage devices.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

What is claimed is:

1. A computer-implemented method, comprising:
    collecting first sensor data for an environment around an autonomous vehicle (AV) at a first time;
    as the AV navigates, dynamically creating a geometric model of the AV, wherein the geometric model specifies physical boundaries of the AV in three-dimensional (3D) space captured by the first sensor data;
    creating a first mask from the geometric model that distinguishes a first set of sensor data that corresponds with a surface of the AV from a second set of sensor data that corresponds with environmental data;
    filtering out, based on an application of the first mask to the first sensor data, data points from among the first set of sensor data that corresponds with the surface of the AV;
    collecting second sensor data for the environment around the AV at a second time;
    updating the geometric model to create a second mask based on the second sensor data, wherein the second mask is modified in accordance with the second sensor data;
    filtering out, based on an application of the second mask to the second sensor data, a third set of data points from among the second sensor data that corresponds with the surface of the AV at the second time; and
    navigating the AV based on the filtered second sensor data to exclude the surface of the AV.

2. The computer-implemented method of claim 1, further comprising:
    dynamically identifying the third set of data points from among the second sensor data as self-hit data points instead of a surrounding environment of the AV: and
    categorizing the self-hit data points within the second sensor data.

3. The computer-implemented method of claim 1, further comprising:
    collecting Light Detection and Ranging (LiDAR) test data for the environment around the AV;
    generating the first mask, wherein the first mask is a filter mask based on the geometric model that is created based on the LiDAR test data, and wherein identifying the first set of sensor data that corresponds with the surface of the AV is based on the filter mask.

4. The computer-implemented method of claim 1, wherein the geometric model is based on a combination of a Computer-aided Design (CAD) model of the AV and the second sensor data.

5. The computer-implemented method of claim 1, wherein the second sensor data comprises Light Detection and Ranging (LiDAR) data.

6. The computer-implemented method of claim 1, further comprising:
    collecting test data for the environment around the AV, and wherein the geometric model of the AV is based on the test data.

7. The computer-implemented method of claim 1, wherein the geometric model comprises one or more buffers to facilitate use of the geometric model on different vehicle types.

8. A system for detecting sensor data self-hits, the system comprising:
    one or more processors;
    at least one Light Detection and Ranging (LiDAR) sensor coupled to the one or more processors; and
    a computer-readable medium comprising instructions stored therein, which when executed by the processors, cause the processors to perform operations comprising:
    collecting first sensor data for an environment around an autonomous vehicle (AV) at a first time;
    as the AV navigates, dynamically creating a geometric model of the AV, wherein the geometric model specifies physical boundaries of the AV in three-dimensional (3D) space captured by the first sensor data;
    creating a first mask from the geometric model that distinguishes a first set of sensor data that corresponds with a surface of the AV from a second set of sensor data that corresponds with environmental data;

filtering out, based on an application of the first mask to the first sensor data, data points from among the first set of sensor data that corresponds with the surface of the AV;

collecting second sensor data for the environment around the AV at a second time;

updating the geometric model to create a second mask based on the second sensor data, wherein the second mask is modified in accordance with the second sensor data;

filtering out, based on an application of the second mask to the second sensor data, a third set of data points from among the second sensor data that corresponds with the surface of the AV at the second time; and navigating the AV based on the filtered second sensor data to exclude the surface of the AV.

9. The system of claim 8, wherein the one or more processors are further configured to perform operations comprising:

dynamically identifying the third set of data points from among the second sensor data as self-hit data points instead of a surrounding environment of the AV; and categorizing the self-hit data points within the second sensor data.

10. The system of claim 8, wherein the one or more processors are further configured to perform operations comprising:

collecting Light Detection and Ranging (LiDAR) test data for the environment around the AV;

generating the first mask, wherein the first mask is a filter mask based on the geometric model that is created based on the LiDAR test data, and wherein identifying the first set of sensor data that corresponds with the surface of the AV is based on the filter mask.

11. The system of claim 8, wherein the geometric model is based on a combination of a Computer-aided Design (CAD) model of the AV and the second sensor data.

12. The system of claim 8, wherein the second sensor data comprises Light Detection and Ranging (LiDAR) data.

13. The system of claim 8, wherein the one or more processors are further configured to perform operations comprising:

collecting test data for the environment around the AV, and wherein the geometric model of the AV is based on the test data.

14. The system of claim 8, wherein the geometric model comprises one or more buffers to facilitate use of the geometric model on different vehicle types.

15. A non-transitory computer-readable storage medium comprising instructions stored therein, which when executed by one or more processors, cause the processors to perform operations comprising:

collecting first sensor data for an environment around an autonomous vehicle (AV) at a first time;

as the AV navigates, dynamically creating a geometric model of the AV, wherein the geometric model specifies physical boundaries of the AV in three-dimensional (3D) space captured by the first sensor data;

creating a first mask from the geometric model that distinguishes a first set of sensor data that corresponds with a surface of the AV from a second set of sensor data that corresponds with environmental data;

filtering out, based on an application of the first mask to the first sensor data, data points from among the first set of sensor data that corresponds with the surface of the AV;

collecting second sensor data for the environment around the AV at a second time;

updating the geometric model to create a second mask based on the second sensor data, wherein the second mask is modified in accordance with the second sensor data;

filtering out, based on an application of the second mask to the second sensor data, a third set of data points from among the second sensor data that corresponds with the surface of the AV at the second time; and navigating the AV based on the filtered second sensor data to exclude the surface of the AV.

16. The non-transitory computer-readable storage medium of claim 15, wherein the one or more processors are further configured to perform operations comprising:

dynamically identifying the third set of data points from among the second sensor data as self-hit data points instead of a surrounding environment of the AV; and categorizing the self-hit data points within the second sensor data.

17. The non-transitory computer-readable storage medium of claim 15, wherein the one or more processors are further configured to perform operations comprising:

collecting Light Detection and Ranging (LiDAR) test data for an environment around the AV;

generating the first mask, wherein the first mask is a filter mask based on the geometric model that is created based on the LiDAR test data, and wherein identifying the first set of sensor data that corresponds with the surface of the AV is based on the filter mask.

18. The non-transitory computer-readable storage medium of claim 15, wherein the geometric model is based on a combination of a Computer-aided Design (CAD) model of the AV and the second sensor data.

19. The non-transitory computer-readable storage medium of claim 15, wherein the second sensor data comprises Light Detection and Ranging (LiDAR) data.

20. The non-transitory computer-readable storage medium of claim 15, wherein the one or more processors are further configured to perform operations comprising:

collecting test data for the environment around the AV, and wherein the geometric model of the AV is based on the test data.

\* \* \* \* \*